United States Patent
Sato et al.

(10) Patent No.: US 6,392,715 B1
(45) Date of Patent: May 21, 2002

(54) UHF/VHF TURNER (75) Inventors: Yoshihiro Sato; Masaki Yamamoto, both of Fukushima-ken; Hideo Nishi, Tokyo; Fumiaki Miyamitsu, Oita-ken, all of (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/133,003

(22) Filed: Aug. 12, 1998

(30) Foreign Application Priority Data

Aug. 19, 1997 (JP) ............................................. 9-222676
Apr. 3, 1998 (JP) ........................................... 10-091621

(51) Int. Cl.$^7$ ................................................ H04N 5/50
(52) U.S. Cl. ........................ 348/731; 348/732; 348/733; 348/505; 348/555
(58) Field of Search .................................. 348/731, 732, 348/733, 728, 505, 554, 355, 570; H04N 5/50

(56) References Cited

U.S. PATENT DOCUMENTS

| | | | | |
|---|---|---|---|---|
| 4,025,953 A | * | 5/1977 | Sideris | 348/733 |
| 4,215,372 A | * | 7/1980 | Suzuki | 348/731 |
| 4,249,256 A | * | 2/1981 | Molinari et al. | 455/180 |
| 4,340,975 A | * | 7/1982 | Onishi et al. | 455/315 |
| 4,499,602 A | | 2/1985 | Hermeling, Jr. et al. | 455/180 |
| 4,726,072 A | * | 2/1988 | Yamahita et al. | 455/197.1 |
| 5,068,918 A | * | 11/1991 | Verheihen et al. | 455/142 |
| 5,122,878 A | * | 6/1992 | Heigl et al. | 348/731 |
| 5,200,826 A | * | 4/1993 | Seong | 348/731 |
| 5,311,318 A | * | 5/1994 | Dobrovolny | 348/731 |
| 5,525,937 A | | 6/1996 | Kitazono et al. | 331/49 |
| 5,574,997 A | * | 11/1996 | Hong | 455/180.1 |
| 6,169,569 B1 | * | 1/2001 | Widmer et al. | 725/111 |
| 6,249,673 B1 | * | 6/2001 | Tsui | 340/825.22 |

FOREIGN PATENT DOCUMENTS

| | | |
|---|---|---|
| EP | 0 348 697 A2 | 6/1989 |
| EP | 0385181 * | 9/1990 |
| JP | 2-128438 | 10/1999 |

OTHER PUBLICATIONS

Baars, "ICs and Discrete Semiconductors for TV and VCR Tuners," Electronic Components and Applications, No. 4, Sep. 1989, pp 240–52, XP 000159337, Eindhoven NL.

* cited by examiner

Primary Examiner—John W. Miller
Assistant Examiner—Linus H. Lo
(74) Attorney, Agent, or Firm—Brinks Hofer Gilson & Lione (57) ABSTRACT

There is provided a UHF/VHF tuner in which complication in structure and increase in manufacturing costs are suppressed and broadcast receiving performance is improved by reducing variation in the reception sensitivity according to frequency when broadcast in the VHF band is received. In a UHF/VHF tuner for receiving both of a broadcast in the UHF band and a broadcast in the VHF band, one mixer and one UHF local oscillator are used for the broadcast in the UHF band, and one mixer, a VHF high-band local oscillator which is switched to be connected when the high band is selected and a VHF low-band local oscillator which is switched to be connected when the low band is selected are used for the broadcast in the VHF band.

5 Claims, 5 Drawing Sheets

UHF/VHF TURNER

BACKGROUND OF THE INVENTION

The present invention relates to a UHF/VHF tuner and, more particularly, to a UHF/VHF tuner in which complication in structure and increase in manufacturing costs are suppressed and broadcast receiving performance is improved by reducing variation in the reception sensitivity according to frequencies when a broadcast in the VHF band is received.

Hitherto, in a UHF/VHF tuner for U.S.A., an RF circuit for UHF and an RF circuit for VHF are separately provided and a frequency converting stage of each of the UHF and VHF circuits is constructed by one mixer and one local oscillator.

Figure 3:
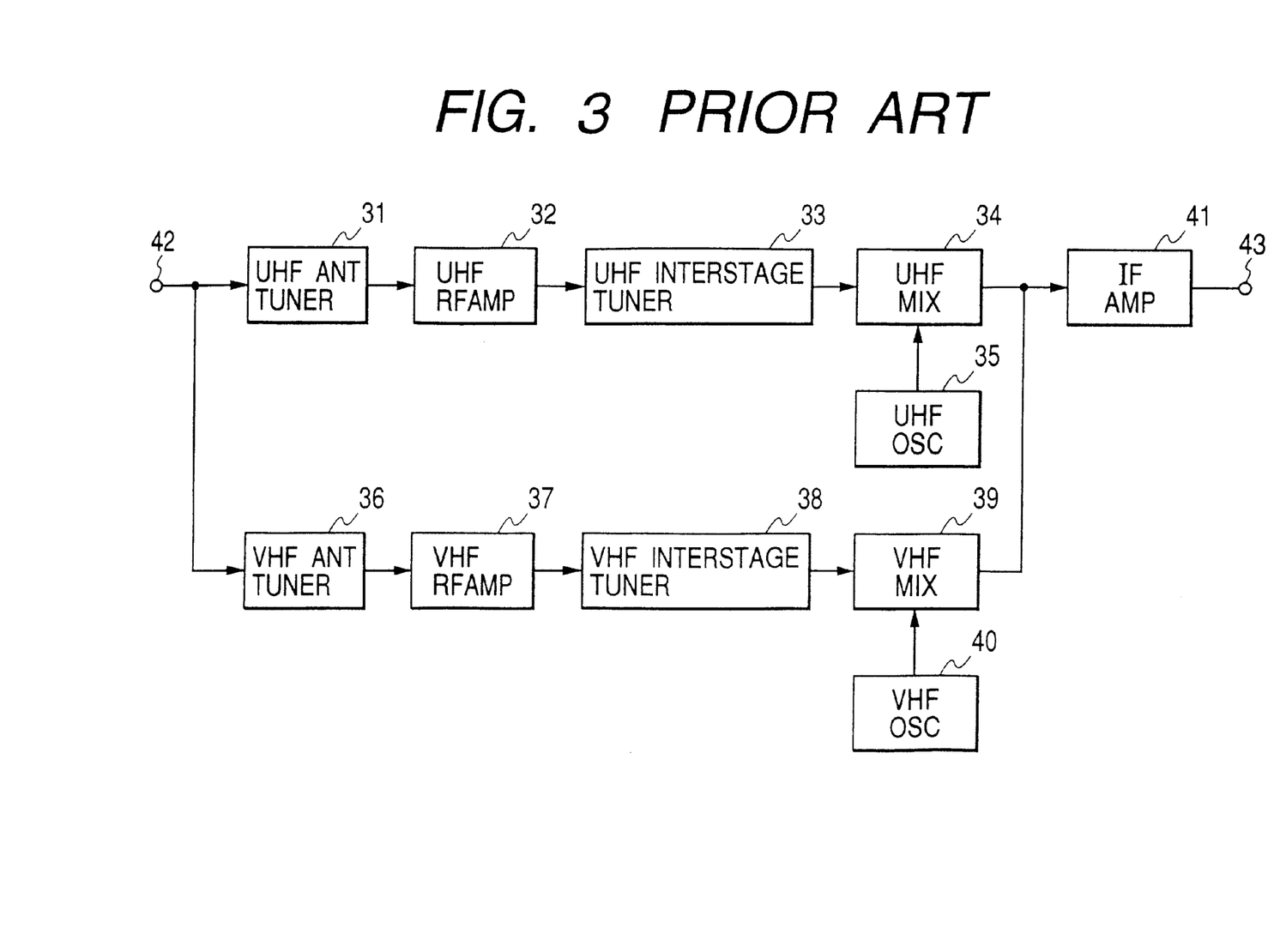
FIG. 3 is a block diagram showing an example of the main construction of a known UHF/VHF tuner.
Figure 4:
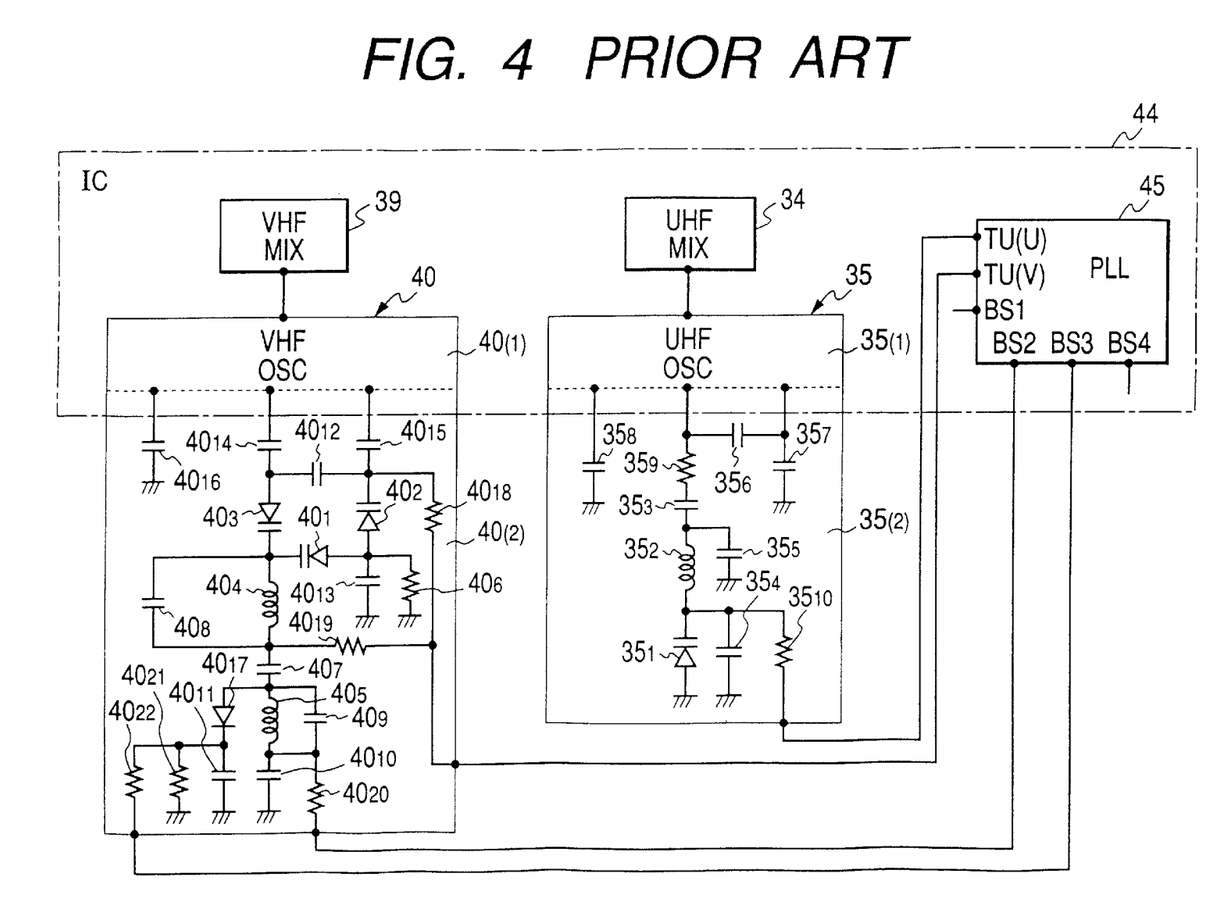
FIG. 4 is a block diagram in which an example of the construction of a frequency conversion stage of the UHF/VHF tuner shown in FIG. 3 is illustrated by a partial circuit diagram.

FIG. 3 is a block diagram showing an example of the construction of main components of a known UHF/VHF tuner. FIG. 4 is a block diagram in which an example of the construction of frequency converting stages of the UHF/VHF tuner shown in FIG. 3 is illustrated in a partial circuit diagram. Component elements which are the same as those shown in FIG. 3 are designated by the same reference numerals.

As shown in FIG. 3, the known UHF/VHF tuner comprises a UHF antenna (ANT) tuning circuit 31, a UHF high frequency amplifier (RFAMP) 32, a UHF interstage tuning circuit 33, a UHF mixer (MIX) 34, a UHF local oscillator (OSC) 35, a VHF antenna (ANT) tuning circuit 36, a VHF high frequency amplifier (RFAMP) 37, a VHF interstage tuning circuit 38, a VHF mixer (MIX) 39, a VHF local oscillator (OSC), 40, an intermediate frequency amplifier (IFAMP) 41, a reception signal input terminal 42, and an intermediate frequency signal output terminal 43. The component elements 31 to 43 are connected as shown in FIG. 3.

As shown in FIG. 4, the UHF local oscillator 35 is constructed by a first circuit part 35(1) including a transistor for oscillation integrated in an integrated circuit 44 and a second circuit part 35(2) externally attached to the integrated circuit 44. The VHF local oscillator 40 is also constructed by a first circuit part 40(1) including a transistor for oscillation integrated in the integrated circuit 44 and a second circuit part 40(2) externally attached to the integrated circuit 44.

The second circuit part 35(2) of the UHF local oscillator 35 comprises a varactor diode $35_1$, an inductor $35_2$, capacitors $35_3$ to $35_8$, and resistors $35_9$ and $35_{10}$. Those elements $3_{51}$ to $35_{10}$ are connected as shown in FIG. 4. The second circuit part 40(2) of the VHF local oscillator 40 comprises varactor diodes $40_1$ to $40_3$, inductors $40_4$ to $40_6$, capacitors $40_7$ to $40_{16}$, a switching diode $40_{17}$, and resistors $40_{18}$ to $40_{23}$. Those elements $40_1$ to $40_{23}$ are connected as shown in FIG. 4. Further, a PLL 45 is arranged in the integrated circuit 44. Band switching terminals BS2 and BS3 in the PLL 45 are connected as shown in FIG. 4 and tuning voltage terminals TU (U) and TU (V) in the PLL 45 are connected also as shown in FIG. 4.

The known UHF/VHF tuner having the above construction operates as follows.

In case of receiving a broadcast in the UHF band, a reception signal is supplied to the reception signal input terminal 42. From the reception signal, only a reception signal of a desired channel is selected by the UHF antenna tuning circuit 31 and is amplified to a predetermined level by the UHF amplifying circuit 32. From the amplified reception signal, only a reception signal of the desired channel is further selected by the UHF interstage tuning circuit 33 and is supplied to the UHF mixer 34. The UHF mixer 34 mixes the frequencies of the reception signal selected by the UHF interstage tuning circuit 33 and a local oscillation signal generated by the UHF local oscillator 35. The intermediate frequency amplifier 41 selectively amplifies an intermediate frequency signal indicative of the frequency as the difference between the reception signal and the local oscillation signal and leads the resultant signal to the intermediate frequency signal output terminal 43.

In this instance, in the UHF local oscillator 35, the oscillation frequency is set by values such as capacitance values of the varactor diode $35_1$ and the capacitors $35_3$ and $35_4$ and the inductance value of the inductor $35_2$. Among them, the capacitance value of the varactor diode $35_1$ is set by an output tuning voltage of the tuning voltage terminal TU (U) in the PLL 45 supplied to the varactor diode $35_1$ via the resistor $35_{10}$.

In the event of receiving a broadcast in the VHF band, a reception signal is supplied to the reception signal input terminal 42. From the reception signal, only a reception signal of a desired channel is selected by the VHF antenna tuning circuit 36 and is amplified by the VHF amplifying circuit 37 to a predetermined level. From the amplified reception signal, only a reception signal of the desired channel is further selected by the VHF interstage tuning circuit 38 and is supplied to the VHF mixer 39. The VHF mixer 39 mixes the frequencies of the reception signal selected by the VHF interstage tuning circuit 38 and the local oscillation signal generated by the VHF local oscillator 40. The intermediate frequency amplifier 41 selectively amplifies an intermediate frequency signal indicative of the frequency as the difference between the reception signal and the local oscillation signal and leads the resultant signal to the intermediate frequency signal output terminal 43.

In this instance, in the VHF local oscillator 40, when a high-band channel is selected, the oscillation frequency is set by values such as capacitance values of the varactor diode 40, and the capacitors $40_7$, $40_8$, and $40_{13}$, and the inductance value of the inductor $40_4$. On the other hand, when a low-band channel is selected, the oscillation frequency is set by values such as capacitance values of the varactor diode $40_1$, and the capacitors $40_7$ to $40_{10}$, and $40_{13}$, and the inductance values of the inductors $40_4$ and $40_5$. When either one of the channels is selected, the capacitance value of the varactor diode $40_1$ is set by an output tuning voltage of the tuning voltage terminal TU (V) in the PLL 45 supplied to the varactor diode $40_1$ via the resistor $40_{18}$. When the high band is selected, a positive voltage is applied to the band switching terminal BS2 in the PLL 45. The positive voltage is supplied to the anode of the switching diode $40_{17}$ through the resistor $40_{20}$ and the inductor $40_5$ to thereby turn on the switching diode $40_{17}$. Consequently, the inductor $40_5$ and the capacitors $40_9$ and $40_{10}$ are bypassed from an oscillation frequency determining circuit in the VHF local oscillator 40. The oscillation frequency determining circuit is constructed by the varactor diode $40_1$, the capacitors $40_7$, $40_8$, and $40_{13}$ and the inductor $40_4$. On the other hand, when the low band is selected, the positive voltage is applied to the band switching terminal BS3 in the PLL 45. The positive voltage is supplied to the cathode of the switching diode $40_{17}$ via the resistor $40_{22}$ to thereby turn off the switching diode $40_{17}$. Consequently, the inductor $40_5$ and the capacitors $40_9$ and $40_{10}$ construct the oscillation frequency determining circuit of the VHF local oscillator 40 together with the varactor diode $40_1$, the capacitors $40_7$, $40_8$, and $40_{13}$, and the inductor $40_4$.

According to the known UHF/VHF tuner, however, when the broadcast in the VHF band is received, it is difficult for the first circuit part 40(1) including the transistor for oscillation to generate a sufficient local oscillation signal in a wide frequency range of both of the high and low bands. In the case where a broadcast of the high frequency side of the high band and/or the low frequency side of the low band is selected, the level of the local oscillation signal becomes lower than that of the local oscillation signal when a broadcast of other frequency is selected and there is a problem such that the reception sensitivity largely varies according to the frequency of the broadcast.

SUMMARY OF THE INVENTION

The invention is to solve the problem and its object is to provide a UHF/VHF tuner in which complication in structure and increase in manufacturing costs are suppressed and broadcast receiving performance is improved by reducing the variation in the reception sensitivity according to the frequency when a broadcast in the VHF band is received.

In order to achieve the object, the UHF/VHF tuner according to the invention comprises means using both of a frequency converting stage having one mixer and one UHF local oscillator for reception of the broadcast in the UHF band and a frequency converting stage having one mixer, a VHF high-band local oscillator and a VHF low-band local oscillator for reception of the broadcast in the VHF band.

According to the means, when the broadcast in the VHF band is received, the VHF high-band local oscillator is used to receive the broadcast of a high-band channel, the VHF low-band local oscillator is used to receive the broadcast of a low-band channel, and a mixer for mixing the frequencies of the reception signal and the local oscillation signal is commonly used for reception of broadcasts of the high and low band channels. Consequently, the reception sensitivity does not largely vary according to the broadcast frequency in the event of receiving the broadcast in the VHF band. Moreover, since only one VHF local oscillator is added as compared with a known tuner of this kind, the construction is not complicated and increase in the manufacturing costs is a little.

In an embodiment of the invention, a UHF/VHF tuner receives both of a broadcast in the UHF band and a broadcast in the VHF band. One mixer and one local oscillator are used for the broadcast in the UHF band and one mixer and two local oscillators which are switched in correspondence to the broadcast reception band are used for the broadcast in the VHF band In a preferred embodiment of the invention, the two local oscillators of the UHF/VHF tuner can be switched by an output of a band decoder in a PLL.

According to the embodiments of the invention, in the event of receiving a broadcast in the VHF band, a VHF high-band local oscillator is used for receiving a high-band channel broadcast and a VHF low-band local oscillator is used for receiving a low-band channel broadcast. Consequently, the signal level difference between the oscillation frequencies in the bands is reduced and the mixer for mixing the frequencies of the reception signal and the local oscillation signal is used for reception of both of the broadcasts in the high-band and low-band channels. When the broadcast in the VHF band is received, the reception sensitivity does not largely vary according to the broadcast frequency. The broadcast reception performance can be therefore improved. Moreover, when it is compared with a known tuner of this kind, only one VHF local oscillator is just added. Thus, the construction is not complicated and increase in the manufacturing costs is a little.

DETAILED DESCRIPTION OF THE PREFERRED EMBODIMENTS

Embodiments of the invention will be described hereinbelow with reference to the drawings.

Figure 1:
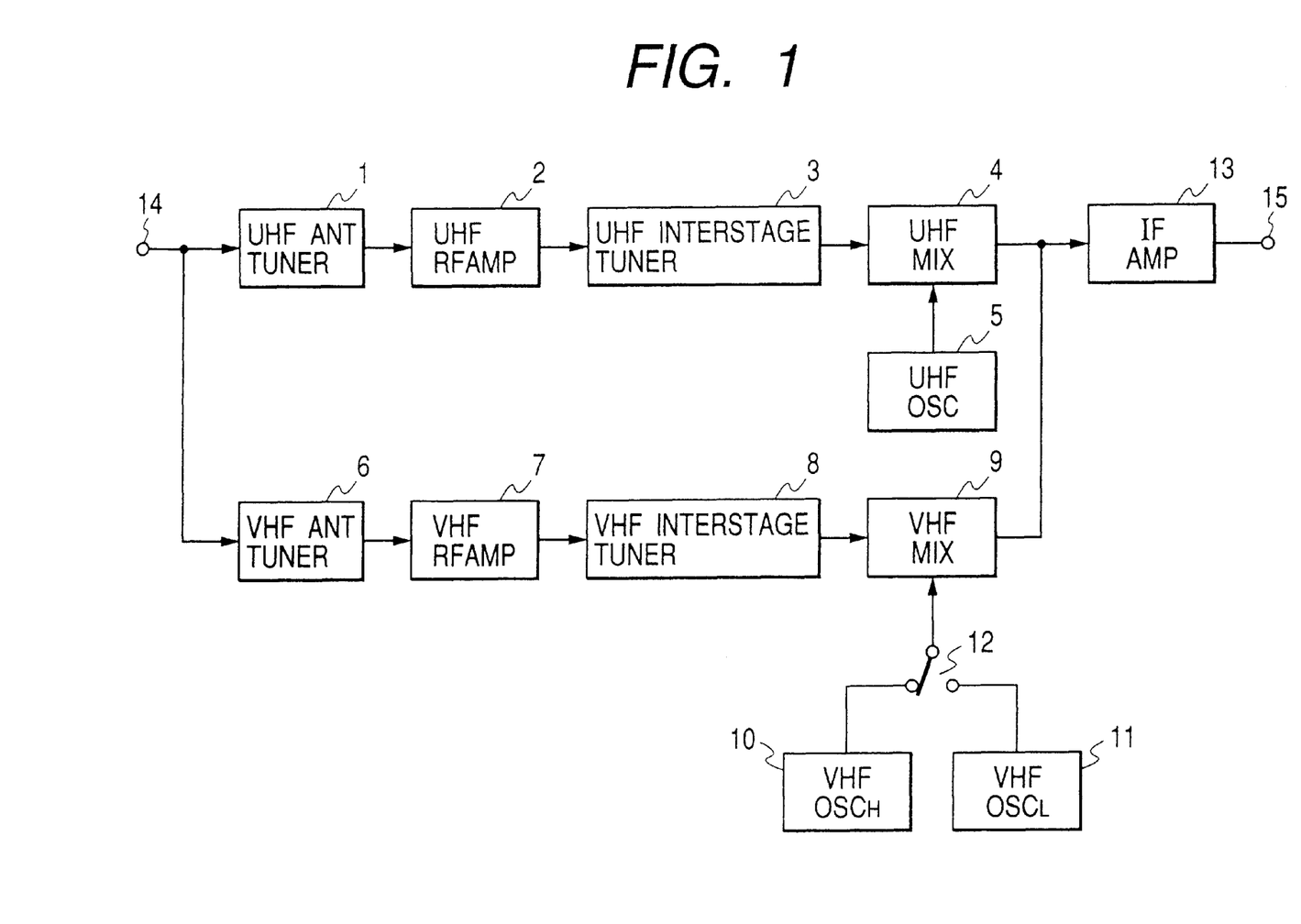
FIG. 1 is a block diagram showing the main construction part of an embodiment of a UHF/VHF tuner according to the invention.
Figure 2:
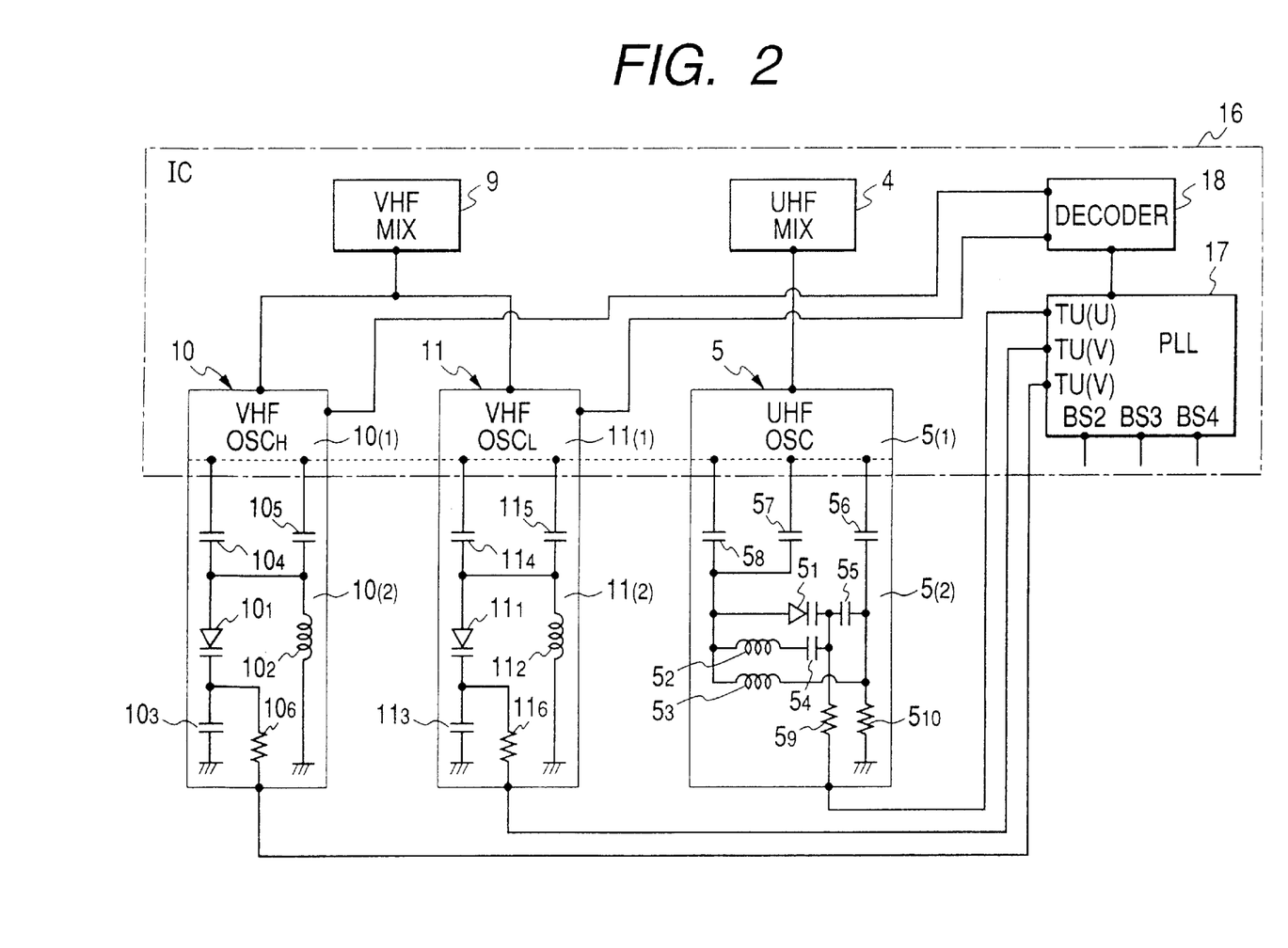
FIG. 2 is a block diagram in which an example of the construction of frequency conversion stages of the UHF/VHF tuner shown in FIG. 1 is illustrated by a partial circuit diagram.

FIG. 1 is a block diagram showing a main construction part of an embodiment of a UHF/VHF tuner according to the invention. FIG. 2 is a block diagram in which an example of the construction of frequency converting stages of the UHF/VHF tuner shown in FIG. 1 is illustrated by a partial circuit diagram.

As shown in FIG. 1, the UHF/VHF tuner of the embodiment comprises a UHF antenna (ANT) tuning circuit 1, a UHF high-frequency amplifier (RFAMP) 2, a UHF interstage tuning circuit 3, a UHF mixer (MIX) 4, a UHF local oscillator (OSC) 5, a VHF antenna (ANT) tuning circuit 6, a VHF high-frequency amplifier (RFAMP) 7, a VHF interstage tuning circuit 8, a VHF mixer (MIX) 9, a VHF high-band local oscillator ($OSC_H$) 10, a VHF low-band local oscillator ($OSC_L$) 11, a change-over switch 12, an intermediate frequency amplifier (IFAMP) 13, a reception signal input terminal 14, and an intermediate frequency signal output terminal 15.

The input terminal of the UHF antenna tuning circuit 1 is connected to the reception signal input terminal 14 and the output terminal is connected to the input terminal of the UHF high-frequency amplifier 2. The input terminal of the UHF interstage tuning circuit 3 is connected to the output terminal of the UHF high-frequency amplifier 2 and the output terminal is connected to a first input terminal of the UHF mixer 4. A second input terminal of the UHF mixer 4 is connected to the output terminal of the UHF local oscillator 5 and the output terminal is connected to the input terminal of the intermediate frequency amplifier 13. The output terminal of the intermediate frequency amplifier 13 is connected to the intermediate frequency signal output terminal 15.

The input terminal of the VHF antenna tuning circuit 6 is connected to the reception signal input terminal 14 and the output terminal is connected to the input terminal of the VHF high-frequency amplifier 7. The input terminal of the VHF interstage tuning circuit 8 is connected to the output terminal of the VHF high-frequency amplifier 7 and the output terminal is connected to a first input terminal of the VHF mixer 9. A second input terminal of the VHF mixer 9 is connected to a moving contact of the change-over switch 12 and the output terminal is connected to the input terminal of the intermediate frequency amplifier 13. In the change-over switch 12, one fixed contact is connected to the output terminal of the high-band local oscillator 10 and the other fixed contact is connected to the output terminal of the low-band local oscillator 11.

As shown in FIG. 2, the UHF local oscillator 5 is constructed by a first circuit part 5(1) including a transistor for oscillation integrated in the integrated circuit 16 and a second circuit part 5(2) externally attached to the integrated circuit 16. The VHF high-band local oscillator 10 is constructed by a first circuit part 10(1) including a transistor for oscillation integrated in the integrated circuit 16 and a second circuit part 10(2) externally attached to the integrated circuit 16. The VHF low-band local oscillator 11 is constructed by a first circuit part 11(1) including a transistor for oscillation integrated in the integrated circuit 16 and a second circuit part 11(2) externally attached to the integrated circuit 16. In the integrated circuit 16, the PLL 17 and the decoder 18 are integrated.

In this case, the second circuit part 5(2) of the UHF local oscillator 5 comprises a varactor diode $5_1$, inductors $5_2$ and $5_3$ capacitors $5_4$ to $5_8$, and resistors $5_9$ and $5_{10}$. In the varactor diode $5_1$, the anode is connected to one end of each of the inductors $5_2$ and $5_3$ and one end of each of the capacitors $5_7$ and $5_8$ and the cathode is connected to one end of each of the capacitors $5_4$ and $5_5$ and one end of the resistor $5_9$. The other end of the inductor $5_2$ is connected to the other end of the capacitor $5_4$. The other end of the inductor $5_3$ is connected to the other end of the capacitor $5_5$ and one end of the resistor $5_{10}$. One end of the capacitor $5_6$ is connected to the other end of the capacitor $5_5$ and the other end is connected to the first circuit part 5(1). The other end of each of the capacitors $5_7$ and $5_8$ is connected to the first circuit part 5(1). The other end of the resistor $5_9$ is connected to the tuning voltage terminal TU (U) in the PLL 17 and the other end of the resistor $5_{10}$ is connected to the ground.

The second circuit part 10(2) of the VHF high-band local oscillator 10 comprises a varactor diode $10_1$, an inductor $10_2$, capacitors $10_3$ to $10_5$, and a resistor $10_6$. In the varactor diode $10_1$, the anode is connected to one end of the inductor $10_2$ and one end of each of the capacitors $10_4$ and $10_5$ and the cathode is connected to one end of the capacitor $10_3$ and one end of the resistor $10_6$. The other end of each of the inductor $10_2$ and the capacitor $10_3$ is connected to the ground. The other end of each of the capacitors $10_4$ and $10_5$ is connected to the first circuit part 10(1). The other end of the resistor $10_6$ is connected to the tuning voltage terminal TU (V) in the PLL 17.

The second circuit part 11(2) of the VHF low-band local oscillator 11 comprises a varactor diode $11_1$, an inductor $11_2$, capacitors $11_3$ to $11_5$, and a resistor $11_6$. Since the connection relation of those elements $11_1$ to $11_6$ is the same as that of the corresponding elements $10_1$ to $10_6$ of the second circuit part 10(2), further description is omitted here.

The UHF/VHF tuner of the embodiment having the above construction operates as follows.

In case of receiving a broadcast in the UHF band, a reception signal is supplied to the reception signal input terminal 14. From the reception signal, only a reception signal of a desired channel is selected by the UHF antenna tuning circuit 1 and is amplified to a predetermined level by the UHF amplifying circuit 2. From the amplified reception signal, only a reception signal of a desired channel is further selected by the UHF interstage tuning circuit 3 and is supplied to the UHF mixer 4. The UHF mixer 4 mixes the frequencies of the reception signal of the desired channel selected by the UHF interstage tuning circuit 3 and the local oscillation signal generated by the UHF local oscillator 5. The intermediate frequency amplifier 13 selectively amplifies an intermediate frequency signal indicative of the frequency as the difference between the reception signal and the local oscillation signal and leads it to the intermediate frequency signal output terminal 15.

In this instance, in the UHF local oscillator 5, the oscillation frequency is set mainly by values such as capacitance values of the varactor diode $5_1$ and the capacitors $5_4$ and $5_5$ and inductance values of the inductors $5_2$ and $5_3$. Among them, the capacitance value of the varactor diode $5_1$ is set by the output tuning voltage of the tuning voltage terminal TU (U) in the PLL 17 which is supplied via the resistor $5_9$ to the varactor diode $5_1$.

In case of receiving a high-band channel broadcast in the VHF band, the change-over switch 12 is switched to the VHF high-band local oscillator 10 side. A reception signal is supplied to the reception signal input terminal 14. From the reception signal, only a reception signal of a desired channel is selected by the VHF antenna tuning circuit 6 and is amplified to a predetermined level by the VHF amplifying circuit 7. From the amplified reception signal, only a reception signal of a desired channel is further selected by the VHF interstage tuning circuit 8 and is supplied to the VHF mixer 9. The VHF mixer 9 mixes the frequencies of the reception signal selected by the VHF interstage tuning circuit 8 and the local oscillation signal generated by the VHF high-band local oscillator 10. The intermediate frequency amplifier 13 selectively amplifies an intermediate frequency signal indicative of the frequency as the difference between the reception signal and the local oscillation signal and leads it to the intermediate frequency signal output terminal 15.

In this instance, in the VHF high-band local oscillator 10, the oscillation frequency is mainly set by values such as capacitance values of the varactor diode $10_1$ and the capacitor $10_3$ and the inductance value of the inductor $10_2$. The capacitance value of the varactor diode $10_1$ is set by the tuning voltage generated from the tuning voltage terminal TU (V) in the PLL 17 which is supplied via the resistor $10_6$ to the varactor diode $10_1$.

On the contrary, in case of receiving a low-band channel broadcast in the VHF band, the change-over switch 12 is switched to the VHF low-band local oscillator 11 side. A reception signal is supplied to the reception signal input terminal 14. From the reception signal, only a reception signal of a desired channel is selected by the VHF antenna tuning circuit 6 and is amplified to a predetermined level by the VHF amplifying circuit 7. From the amplified reception signal, only a reception signal of a desired channel is further selected by the VHF interstage tuning circuit 8 and is supplied to the VHF mixer 9. The VHF mixer 9 mixes the frequencies of the reception signal selected by the VHF interstage tuning circuit 8 and a local oscillation signal generated by the VHF low-band local oscillator 11. The intermediate frequency amplifier 13 selectively amplifies an intermediate frequency signal indicative of the frequency as the difference between the reception signal and the local oscillation signal and leads the resultant signal to the intermediate frequency signal output terminal 15.

In this instance, in the VHF low-band local oscillator 11, the oscillation frequency is mainly set by values such as capacitance values of the varactor diode $11_1$ and the capacitor $11_3$ and the inductance value of the inductor $11_2$. The capacitance value of the varactor diode $11_1$ is set by the tuning voltage generated from the tuning voltage terminal TU (V) in the PLL 17 which is supplied via the resistor $11_6$ to the varactor diode $11_1$.

In the embodiment, when the change-over switch 12 is switched, a band selection signal is supplied from the outside of the integrated circuit 16 to the decoder 18 in correspondence to the selection of the broadcast of the VHF high-band channel or the selection of the broadcast of the VHF low-band channel. The decoder 18 switches the oscillators as follows. When the decoder 18 decodes the band selection signal and the broadcast of the VHF high-band channel is selected, a drive signal is supplied to the VHF high-band local oscillator 10 to thereby operate the VHF high-band local oscillator 10. When the broadcast of the VHF low-band channel is selected, the decoder 18 supplies a drive signal to the VHF low-band local oscillator 11 to thereby operate the VHF low-band local oscillator 11.

In the foregoing embodiment, the example of switching the VHF high-band local oscillator 10 and the VHF low-band local oscillator 11 which are used in correspondence to the selection of the broadcast of the VHF high-band channel and the VHF low-band channel by the drive signal generated by the decoder 18 has been mentioned. The switching of the VHF high-band local oscillator 10 and the VHF low-band local oscillator 11 according to the invention, however, is not limited by the example in which it is realized by the drive signal generated by the decoder 18. It will be obviously understood that other switching means can be also used.

The technical range of the VHF high band and the VHF low band in the foregoing embodiment includes not only the ranges of the VHF high band and the VHF low band in the regular concept but also a case where the low band in the UHF band is included in the VHF high band and the VHF mid-band is included in the VHF low band.

Figure 5:
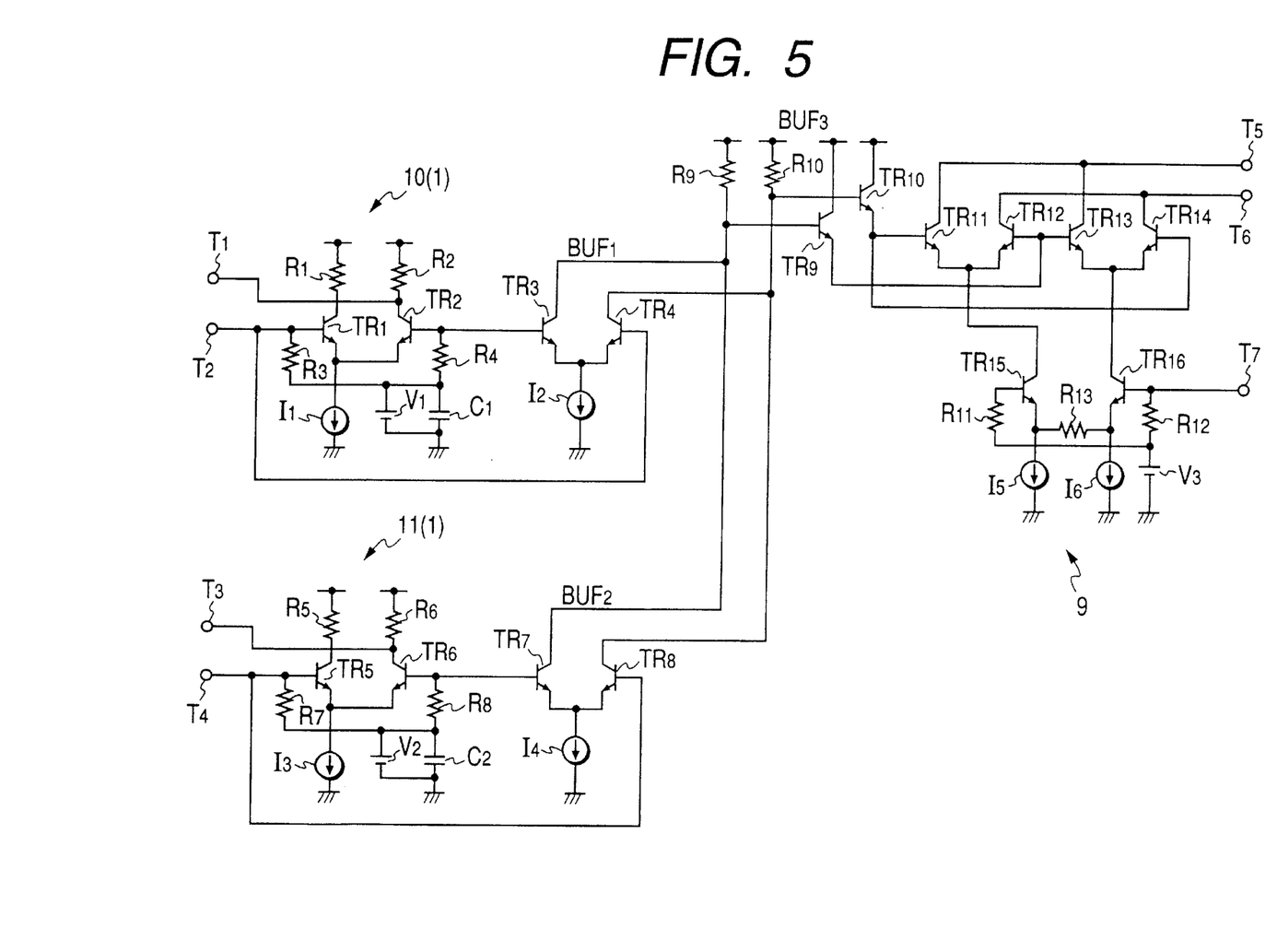
FIG. 5 is a circuit diagram showing an example of the construction of a specific circuit of a first circuit part of a VHF high-band local oscillator, a first circuit part of a VHF low-band local oscillator, and a VHF mixer which are integrated in an integrated circuit shown in FIG. 2.

FIG. 5 is a circuit diagram showing an example of the construction of a specific circuit of the first circuit part 10(1) of the VHF high-band local oscillator 10, the first circuit part 11(1) of the VHF low-band local oscillator 11, and the VHF mixer 16 which are integrated in the integrated circuit 16 shown in FIG. 2.

As shown in FIG. 5, the first circuit part 10(1) of the VHF high-band local oscillator 10 comprises two transistors $TR_1$ and $TR_2$ which are differentially connected, four resistors $R_1$, $R_2$, $R_3$, and $R_4$, a current source $I_1$, a voltage source $V_2$, and a capacitor $C_1$. A part constructed by two transistors $TR_3$ and $TR_4$ which are differentially connected and a current source $I_2$ takes the form of a first buffer circuit $BUF_1$. Two terminals $T_1$ and $T_2$ in the first circuit part 10(1) are connected to the capacitors $10_4$ and $10_5$ shown in FIG. 2.

On the other hand, the first circuit part 11(1) of the VHF low-band local oscillator 11 comprises two transistors $TR_4$ and $TR_6$ which are differentially connected, four resistors $R_5$, $R_6$, $R_7$, and $R_8$, a current source $I_3$, a voltage source $V_2$, and a capacitor $C_2$. A part comprising two transistors $TR_7$ and $TR_8$ which are differentially connected and a current source $I_4$ constructs a second buffer circuit $BUF_2$. Two terminals T3 and T4 in the first circuit part 11(1) of the VHF low-band local oscillator 11 are connected to the capacitors $11_4$ and $11_5$ shown in FIG. 2.

Each of the VHF high-band local oscillator 10 and the VHF low-band local oscillator 11 takes the form of an LC feedback type oscillation circuit having an inductance L and a capacitance C in a feedback circuit. The oscillation frequency of each of them is determined by a circuit constant of each element of each of the second circuit part 10(2) and the second circuit part 11(2).

The first and second buffer circuits $BUF_1$ and $BUF_2$ operate to convert the local oscillation signals generated by the VHF high-band local oscillator 10 and the VHF low-band local oscillator 11 into current mode signals, respectively.

A part constructed by two transistors $TR_9$ and $TR_{10}$ and two resistors $R_9$ and $R_{10}$ takes the form of a third buffer circuit $BUF_3$. The third buffer circuit $BUF_3$ converts current mode signals supplied from the first and second buffer circuits $BUF_1$ and $BUF_2$ into voltage mode signals, respectively, and supplies the voltage mode signals to the VHF mixer 9.

The VHF mixer 9 takes the form of a double-balanced mixer and comprises total six transistors, that is, differentially connected transistors $TR_{11}$ and $TR_{12}$, differentially connected transistors $TR_{13}$ and $TR_{14}$, and differentially connected transistors $TR_{15}$ and $TR_{16}$, three resistors $R_{11}$, $R_{12}$, and $R_{13}$, two current sources $I_5$ and $I_6$, and a voltage source $V_3$. A circuit part including the differentially connected transistors $TR_{11}$ and $TR_{12}$ and the differentially connected transistors $TR_{13}$ and $TR_{14}$ construct a first differential stage and a circuit part including the differentially connected transistors $TR_{15}$ and $TR_{16}$ constructs a second differential stage. A reception signal selected by the VHF interstage tuning circuit 8 shown in FIG. 1 is supplied to a terminal $T_7$ in the VHF mixer 9. From each of terminals $T_5$ and $T_6$, a mixed signal obtained by mixing the frequencies of the reception signal selected by the VHF interstage tuning circuit 8 and the local oscillation signal generated by the VHF high band local oscillator 10 or the VHF low-band local oscillator 11 is outputted and is supplied to the intermediate frequency amplifier 13 shown in FIG. 1. In this case, when it is assumed that the frequency of the reception signal is $f_{VHF}$ and the frequency of the local oscillation signal is $f_{OSC}$, a differential signal of the mixed signal of both of a signal having the frequency of ($f_{OSC}+f_{VHF}$) and a signal having the frequency of ($f_{OSC}-f_{VHF}$) is generated to the terminals $T_5$ and $T_6$.

The active and inactive operations of the first circuit part 10(1) of the VHF high-band local oscillator 10 and the first circuit part 11(1) of the VHF low-band local oscillator 11 are switched by turning on/off the current sources $I_1$ and $I_2$, respectively. When the VHF high-band local oscillator 10 is selected, it is sufficient to switch the current source $I_1$ to the active operation and to switch the current source $I_2$ to the inactive operation. When the VHF low-band local oscillator 11 is selected, it is sufficient to switch the current source $I_1$ to the inactive operation and to switch the current source $I_2$ to the active operation.

With respect to the first buffer circuit $BUF_1$, the second buffer circuit $BUF_2$, and the VHF mixer 9 as well, by switching the current source $I_2$, the current source $I_4$, and the current sources $I_5$ and $I_6$, respectively, the operating mode can be switched to the active or inactive operation.

Since the local oscillation signal from the VHF high-band local oscillator 10 and the local oscillation signal from the VHF low-band local oscillator 11 are converted to current mode signals by the first buffer circuit $BUF_1$ and the second buffer circuit $BUF_2$, the VHF high-band local oscillator 10 or the VHF low-band local oscillator 11 in the inactive operating state does not exert an influence on the VHF low-band local oscillator 11 or the VHF high-band local oscillator 10 in the active operating state.

The first circuit part 5(1) of the UHF local oscillator 5 and the UHF mixer 4 can be constructed by circuits similar to those of the first circuit part 10(1) of the VHF high-band local oscillator 10 and the VHF mixer 9, respectively.

As mentioned above, according to the invention, in case of receiving the broadcast in the VHF band, the VHF high-band local oscillator is used to receive the broadcast of the high-band channel and the VHF low-band local oscillator is used to receive the broadcast of the low-band channel, thereby reducing the level difference of the oscillation signals of the bands. Consequently, when the broadcast in the VHF band is received, the reception sensitivity does not largely vary according to the broadcast frequency and there is an effect such that the broadcast reception performance can be improved. The mixer for mixing the frequencies of the reception signal and the local oscillation signal is used at the time of the reception of the broadcast of the high-band channel and the reception of the broadcast of the low-band channel. Consequently, since only one VHF local oscillator is added as compared with the construction of the known tuner of this kind, there are effects such that the construction is not complicated and the manufacturing costs are not increased.

What is claimed:

1. A UHF/VHF tuner for receiving a television broadcast in the UHF band and a television broadcast in the VHF band, comprising:

a first mixer and a first local oscillator for reception of the television broadcast in the UHF band;

a second mixer and a second and third local oscillator which are switched corresponding to a television broadcast reception band for reception of the television broadcast in the VHF band;

a PLL circuit; and a band decoder, wherein each of the first, second, and third local oscillators includes a first circuit having an oscillator transistor and a second circuit including a varactor diode, a capacitor, and an inductor, the first and second mixers, the PLL circuit, and the band decoder, and the first circuit of each of the first, second, and third local oscillators are integrated into an integrated circuit, and said second circuit of each of the first, second, and third local oscillators is externally attached to the integrated circuit.

2. The UHF/VHF tuner according to claim 1, wherein said band decoder decodes a band selection signal supplied to said band decoder and switches said second and third local oscillators according to an output signal of said band decoder thereby operating said second and third local oscillators.

3. The UHF/VHF tuner according to claim 2, wherein said first circuit of each of said second and third local oscillators includes a differential stage which is constructed by transistors and a current source to supply a current to said differential stage, and said current source of said first circuit of one of said second and third local oscillators is switched on and off according to the output signal from said band decoder, an output of an oscillation signal is on/off controlled by an on/off operation of said current source, said second mixer has a first differential stage which is constructed by transistors and to which an oscillation signal from one of said second and third local oscillators is supplied, a second differential stage which is constructed by transistors and to which a VHF signal is supplied, and a current source for supplying a current to said first and second differential stages, and the second mixer outputs a mixed signal obtained by mixing the frequencies of said oscillation signal and said VHF signal.

4. A UHF/VHF tuner for receiving a television broadcast in the UHF band and a television broadcast in the VHF band, comprising:

a first mixer and a first local oscillator for reception of the television broadcast in the UHF band;

a second mixer and a second and third local oscillator which are switched corresponding to a television broadcast reception band for reception of the television broadcast in the VHF band;

a switch connected with the second mixer and having a moving connection that switches between the second and third local oscillators;

a band decoder to receive and decode a band selection signal and supply a drive signal to one of the second and third local oscillators dependent on the VHF band.

5. The UHF/VHF tuner according to claim 4, wherein the first circuit of each of the second and third local oscillators includes a differential stage which is constructed by transistors and a current source to supply a current to the differential stage, and the current source of the first circuit of one of the second and third local oscillators is switched on and off according to the output signal from the band decoder, an output of an oscillation signal is on/off controlled by and on/off operation of the current source, the second mixer has a first differential stage which is constructed by transistors and to which an oscillation signal from one of the second and third local oscillators is supplied, a second differential stage which is constructed by transistors and to which a VHF signal is supplied, and a current source for supplying a current to the first and second differential stages, and the second mixer outputs a mixed signal obtained by mixing the frequencies of the oscillation signal and the VHF signal.

* * * * *

UNITED STATES PATENT AND TRADEMARK OFFICE
CERTIFICATE OF CORRECTION

PATENT NO. : 6,392,715 B1
DATED : May 21, 2002
INVENTOR(S) : Yoshihiro Sato et al.

It is certified that error appears in the above-identified patent and that said Letters Patent is hereby corrected as shown below:

<u>Title page, Item [54] and Column 1, line 1,</u>
Delete "TURNER" and substitute -- TUNER -- in its place.

<u>Column 10,</u>
Line 31, after "VHF band" delete "." (period) and substitute -- ; and -- in its place.
After line 31, insert the following paragraphs:

```
    --a PLL circuit;
    wherein:
    the second and third local oscillators include a
differential stage having transistors and a current
source to supply a current to the differential stage,
    an output of an oscillation signal is on/off
controlled by an on/off operation of the current
source,
    the second mixer of the VHF band has a first
differential stage having transistors and to which an
oscillation signal from one of the second and third
local oscillators is supplied, a second differential
stage having transistors and to which a VHF signal is
supplied, and a current source to supply a current to
the first and second differential stages, and
    the mixer outputs a mixed signal obtained by
mixing the frequencies of the oscillation signal and
the VHF signal
    each of the first, second, and third local
oscillators includes a first circuit having an
oscillator transistor and a second circuit including
a varactor diode, a capacitor, and an inductor,
    the first and second mixers, the PLL circuit,
and the band decoder, and the first circuit of each
of the first, second, and third local oscillators are
integrated into an integrated circuit, and
    the second circuit of each of the first, second,
and third local oscillators is externally attached to
the integrated circuit.--.
```

UNITED STATES PATENT AND TRADEMARK OFFICE
CERTIFICATE OF CORRECTION

PATENT NO. : 6,392,715 B1
DATED : May 21, 2002
INVENTOR(S) : Yoshihiro Sato et al.

It is certified that error appears in the above-identified patent and that said Letters Patent is hereby corrected as shown below:

<u>Column 10 cont'd,</u>
Line 41, delete "and" and substitute -- an -- in its place.

Signed and Sealed this

Fourth Day of November, 2003

JAMES E. ROGAN
*Director of the United States Patent and Trademark Office*